(12) United States Patent
Röhr

(10) Patent No.: US 7,423,281 B2
(45) Date of Patent: Sep. 9, 2008

(54) MICROELECTRONIC DEVICE WITH A PLURALITY OF STORAGE ELEMENTS IN SERIAL CONNECTION AND METHOD OF PRODUCING THE SAME

(75) Inventor: Thomas Röhr, Aschheim (DE)

(73) Assignee: Infineon Technologies AG, Munich (DE)

( * ) Notice: Subject to any disclaimer, the term of this patent is extended or adjusted under 35 U.S.C. 154(b) by 95 days.

(21) Appl. No.: 11/234,375

(22) Filed: Sep. 26, 2005

(65) Prior Publication Data
US 2007/0069273 A1   Mar. 29, 2007

(51) Int. Cl.
*H01L 29/02* (2006.01)
(52) U.S. Cl. .................... 257/2; 257/3; 257/4; 257/5
(58) Field of Classification Search .............. 257/1–5, 257/311; 438/800, 900
See application file for complete search history.

(56) References Cited

U.S. PATENT DOCUMENTS

| | | | |
|---|---|---|---|
| 5,313,418 A * | 5/1994 | Wada et al. ............ | 365/104 |
| 5,761,115 A | 6/1998 | Kozicki | |
| 6,363,002 B1 | 3/2002 | Nishimura | |
| 2002/0079520 A1 * | 6/2002 | Nishihara et al. ....... | 257/245 |
| 2002/0097598 A1 | 7/2002 | Hoenigschmid | |
| 2003/0137869 A1 | 7/2003 | Kozicki | |
| 2003/0209971 A1 | 11/2003 | Kozicki | |
| 2004/0017706 A1 | 1/2004 | Freitag et al. | |
| 2004/0056286 A1 | 3/2004 | Jacob et al. | |
| 2005/0248978 A1 * | 11/2005 | Chen et al. ............. | 365/158 |
| 2007/0069273 A1 * | 3/2007 | Rohr ..................... | 257/311 |

FOREIGN PATENT DOCUMENTS

| | | |
|---|---|---|
| EP | 1429342 A | 6/2004 |
| WO | WO-2004/084229 A1 | 9/2004 |
| WO | WO-2005/022548 A1 | 3/2005 |
| WO | WO-2005/117026 A | 12/2005 |

OTHER PUBLICATIONS

Kozicki, M. N. et al. (2002). "Can Solid State Electrochemistry Eliminate the Memory Scaling Quandary?" Proceedings, IEEE-NANO.

(Continued)

*Primary Examiner*—Jerome Jackson
*Assistant Examiner*—Jami M Valentine
(74) *Attorney, Agent, or Firm*—Patterson & Sheridan, L.L.P.

(57) ABSTRACT

The micro electronic device comprises a substrate with a surface and a plurality of storage elements in serial connection formed at the surface of the substrate, a plurality of transistors, each transistor being connected parallel to one of the plurality of storage elements. Each storage element comprises a storing material between a first electrode and a second electrode. A storing material provides at least two different storing states with different electrical properties. The first electrode comprises a first material and the second electrode comprises a second material different from the first material. The plurality of storage elements is oriented parallel to the surface of the substrate.

17 Claims, 11 Drawing Sheets

OTHER PUBLICATIONS

Symanczyk, Ralf et al. "Electrical Characterization of Solid State Ionic Memory Elements," Infineon Technologies, MP TD NMP INN, Munich, Germany (6 pages).

Müller, G. et al. (2004). "Status and Outlook of Emerging Nonvolatile Memory Technologies," *IEDM Technical Digest* 04-567:23.1.1-23.1.4.

Kozicki, M. N. et al. (2002). "Can Solid State Electrochemistry Eliminate the Memory Scaling Quandary?" Proceedings, IEEE-NANO.

Symanczyk, Ralf et al. "Electrical Characterization of Solid State Ionic Memory Elements," Infineon Technologies, MP TD NMP INN, Munich, Germany (6 pages). (2003).

* cited by examiner

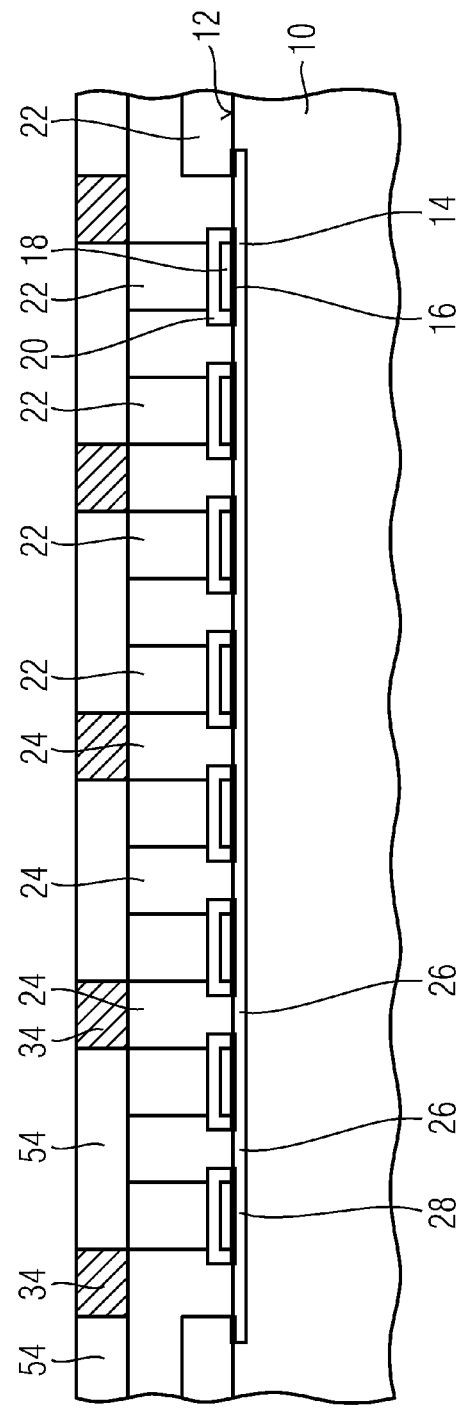
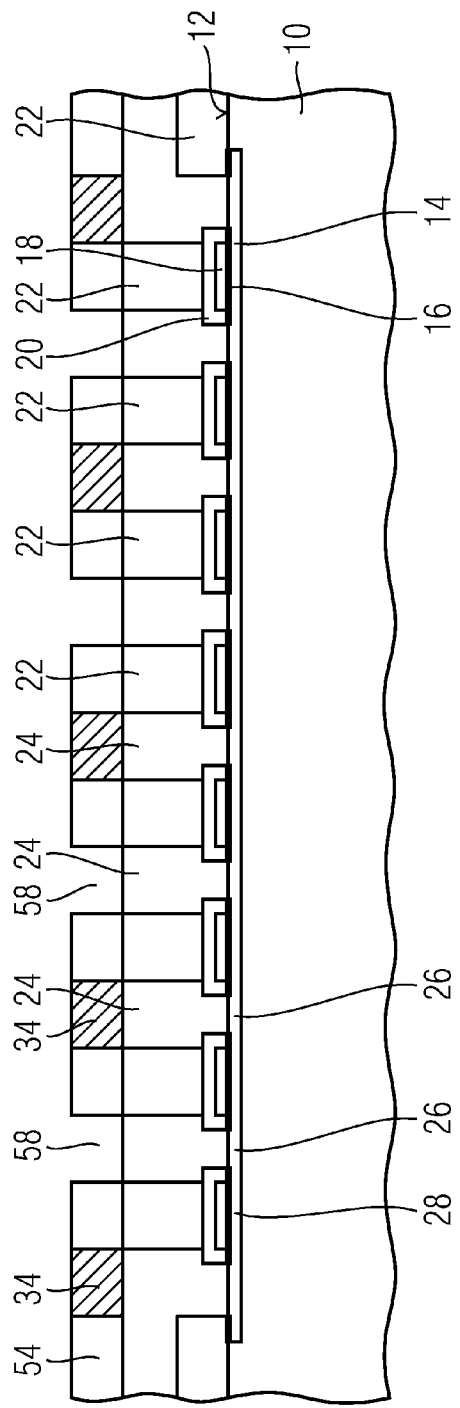
FIG 5
FIG 6

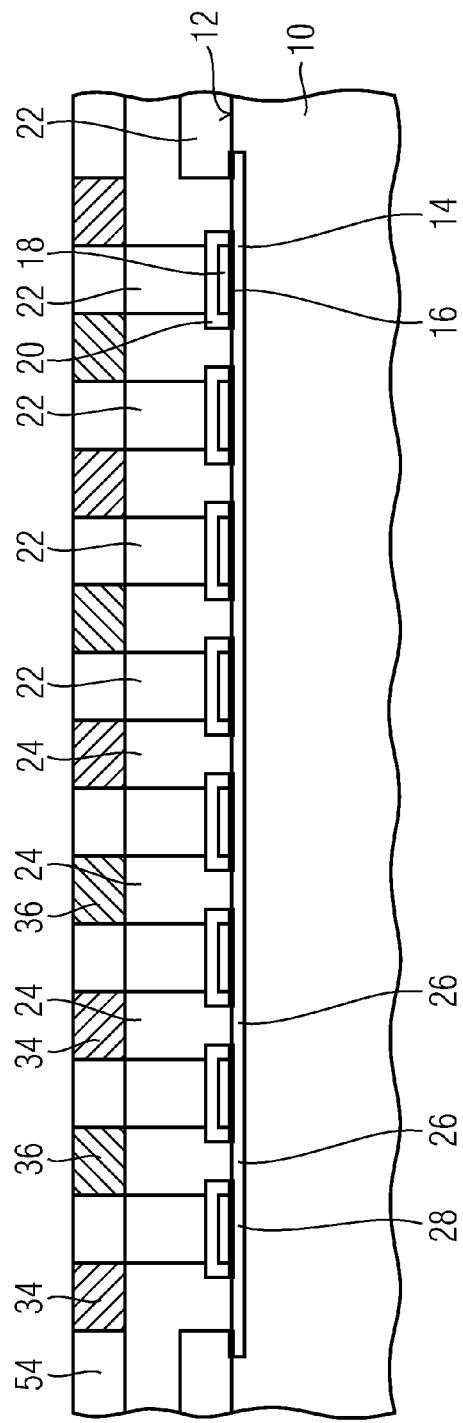
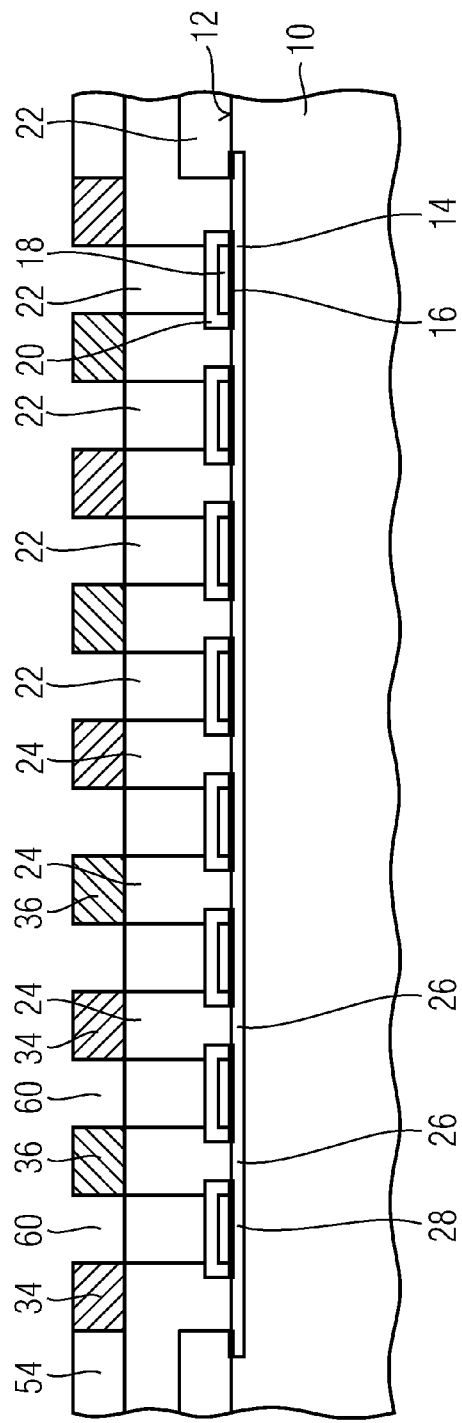

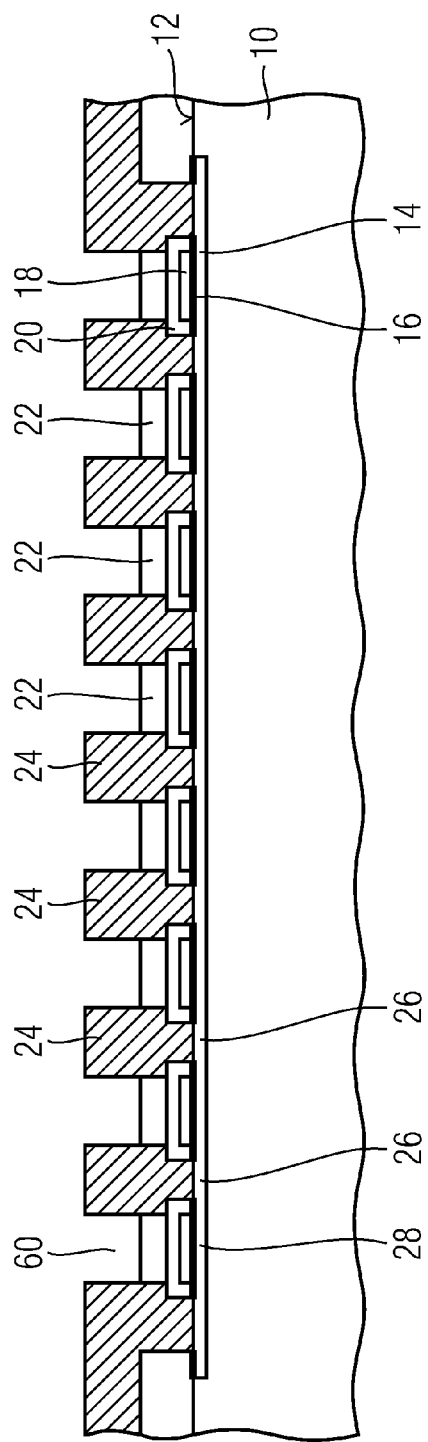
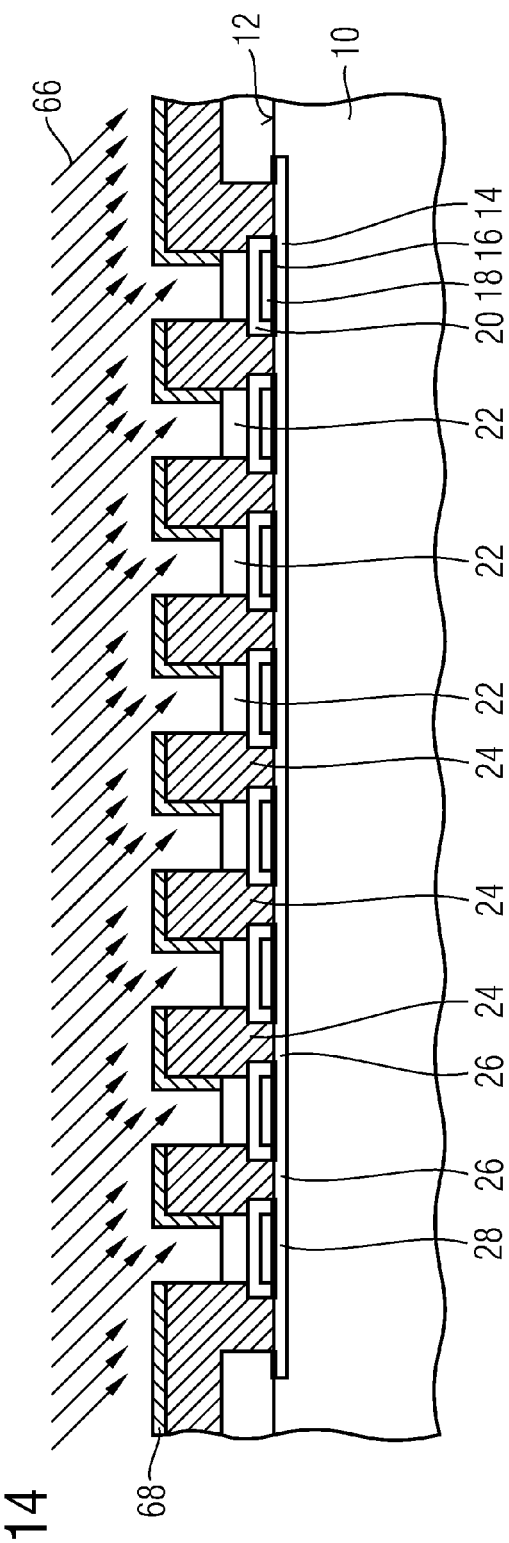

US 7,423,281 B2

MICROELECTRONIC DEVICE WITH A PLURALITY OF STORAGE ELEMENTS IN SERIAL CONNECTION AND METHOD OF PRODUCING THE SAME

TECHNICAL FIELD OF THE INVENTION

The present invention refers to a microelectronic device and method, and in particular, to a device having a plurality of storage elements in a chain architecture and a method of manufacturing such a microelectronic device.

BACKGROUND OF THE INVENTION

Non-volatile memory devices are able to store information without the need of any power supply. For this reason they are very advantageous for many applications, particularly in mobile devices operating a maximum time with a minimum of energy stored in a tiny battery. Similar to other microelectronic devices, the microscopic structures of non-volatile memory devices are constantly miniaturized thereby increasing the storage capacity of the device and lowering its manufacturing costs.

There is a number of different concepts and physical phenomena current and future non-volatile memory devices are based on. In PCRAMs (PCRAM=Phase Change Random Access Memory) each storage element comprises a chalcogenide alloy (for example $Ge_2Sb_2Te_5$) or any other material which is switched between a highly resistive amorphous state and a low resistive crystalline state.

In a CBRAM (CBRAM=Conductive Bridging Random Access Memory), each storage element is a conductive bridging junction (CBJ; further know as PMC=Programmable Metallization Cell). An electrically insulating matrix material comprising small regions or islands of electrically conductive material is arranged between two electrodes. One of these electrodes is chemically inert. Throughout this application, an electrode is called chemically inert if its chemical state is not altered in the process of programming of the storage element. The other electrode comprises an electrochemically active material. A voltage across the storage element above a predefined threshold drives material from the active electrode into the insulating matrix thereby increasing the conductive islands which finally form a conductive bridge across the storage element between the electrodes. This conductive bridge reduces the electrical resistance of the storage element by several orders of magnitude. A voltage with reversed polarity across the storage element drives patterns of the conductive island back to the active electrode thereby reducing the conductive islands, destroying the conductive bridge and increasing the electrical resistance of the storage element by several orders of magnitude.

An advantageous architecture of memory devices with resistive storage elements is the so called NAND or chain architecture. A number of storage elements (for example 8, 16 or 32) are connected in series. A transistor is connected in parallel to each single storage element forming a switchable bypass. For the access to a certain one of the storage elements, the bypass transistor of this certain storage element is in a highly resistive OFF-state while all the other transistors are in a highly conductive ON-state thereby bypassing their respective storage elements. In this way, the voltage applied to the chain of storage elements or a current flowing through the chain solely affect the selected one of the storage elements.

FIG. 20 displays a schematic view of a vertical section across a chain of eight CBJ storage elements in a conventional memory device. FIG. 21 displays a schematic circuit diagram of the chain. The device comprises a substrate 10 with a surface 12. An active area 14 is formed at the surface 12 of the substrate 10. Gate oxide layers 16 electrically insulate word lines 18 from the active area 14. The word lines 18 are covered by a thin electrically insulating layer 20. A thick electrically insulating layer 22 is deposited over the surface 12 of a substrate 10, the word lines 18 and the thin insulating layers 20. Through-hole conductors 24 are arranged in through-holes in the thick insulating layer 22. The lower end of each through-hole conductor 24 abuts on source/drain regions 26 within the active area 14. Those parts of the active area 14 arranged between source/drain regions 26 and directly under gates 18 are channel regions 28. Horizontal beam-shaped first and second electrode bars 30, 32 are arranged at and electrically conductively connected to the upper ends of the through-hole conductors 24. The ends of the electrode bars 30, 32 form first and second electrodes 34, 36. Each second electrode 36 is arranged vertically above a first electrode 34. A storing material 38 is arranged between each pair of first and second electrodes 34, 36. As an example, the first electrodes 34 are made of an electrochemically active material and the second electrodes 36 are made of a chemically inert material as already described above. The storing material 38 is an electrically insulating matrix with small regions or islands of an electrically conductive material.

The source/drain regions 26, the channel regions 28 and the word lines 18 form transistors 42, the word lines 18 serving as gate-electrodes. The conductivities of the channel regions 28 are controlled via voltages applied to the word lines 18. Each storing material 38 together with the adjacent first and second electrodes 34, 36 form a resistive storage element 44. The arrangement of the first and second electrodes 34, 36 and the storing material 38 is such that the direction of the electrical field and of the electrical current within the storing material 38 of each storage element 44 is vertical to the surface 12 of the substrate 10. Therefore, the storage elements 44 are called vertical.

As can be easily seen from FIG. 20, the geometry of the conventional CBRAM device is rather complicated causing high manufacturing costs.

SUMMARY OF THE INVENTION

The present invention refers to a microelectronic device comprising a plurality of storage elements in a chain architecture and a method of manufacturing such a microelectronic device. Each storage element comprises a storing material between two electrodes. The storing material provides at least two different storing states with different electrical properties. According to one embodiment, the two electrodes of the storage element comprise two different materials. According to another embodiment, the storing material is a resistive storing material, wherein the at least two different storing states are resistive states with different resistance values.

The present invention provides a microelectronic device which can be manufactured more easily and generates lower manufacturing costs. The present invention also provides a microelectronic device with a plurality of storage elements in serial connection and a plurality of transistors each transistor being connected parallel to one of the plurality of storage elements. The present invention further provides a microelectronic device each storage element of which providing two different electrodes made of different materials. The present invention still further provides a microelectronic device the storage elements of which are resistive storage elements. The present invention yet further provides a method of producing a microelectronic device.

In one embodiment of the present invention, there is a microelectronic device having a substrate with a surface; a plurality of storage elements in serial connection formed at the surface of the substrate, each storage element comprising a storing material between a first electrode and a second electrode, the storing material providing at least two different storing states with different electrical properties, the first electrode comprising a first material and the second electrode comprising a second material different from the first material; and a plurality of transistors, each transistor being connected parallel to one of the plurality of storage elements, wherein each of the plurality of storage elements is oriented parallel to the surface.

In another embodiment of the present invention, there is a microelectronic device having a substrate with a surface; a plurality of resistive storage elements in serial connection formed at the surface of the substrate, each resistive storage element comprising a resistive material between two electrodes, the resistive material providing at least two different resistive states with different electrical resistance values; and a plurality of transistors, each transistor being connected parallel to one of the plurality of resistive storage elements, wherein each of the plurality of resistive storage elements is oriented parallel to the surface of the substrate.

In still another embodiment of the present invention, there is a microelectronic device having a substrate with a surface; and a storage element comprising a storing material between a first electrode and a second electrode, the storing material providing at least two different storing states with different electrical properties, the first electrode comprising a first material and the second electrode comprising a second material different from the first material, wherein the storage element is oriented parallel to the surface of the substrate.

In still another embodiment of the present invention, there is a method of producing a microelectronic device, the method having providing a substrate with a surface; producing a plurality of transistors with source and drain electrodes at the surface of the substrate, the source electrode of a first one of the plurality of transistors being connected with a drain electrode of a second one of the plurality of transistors; producing an electrically insulating layer over the plurality of transistors; producing a plurality of through holes in the insulating layer, each through hole abutting on the source electrode of one of the plurality of transistors and on the drain electrode of another one of the plurality of transistors; depositing a first electrode material in the plurality of through holes, thereby producing vertical through hole conductors; producing a cavity in the insulating layer, thereby uncovering a part of an essentially vertical side wall of a first one of the through hole conductors and a part of an essentially vertical side wall of a second one of the through hole conductors; in each cavity, depositing a second electrode material on the uncovered part of the essentially vertical side wall of one of the through hole conductors contiguous to the cavity; and depositing a storing material in the cavity, the storing material providing at least two different storing states with different electrical properties.

The present invention refers to microelectronic devices with storage elements each of which comprising a storage material between two different electrodes. The present invention discloses arrangement of these storage elements horizontally, i.e. the direction of the electrical field and the direction of any current flowing in the storage elements are essentially parallel to the surface of the substrate of the microelectronic device. Furthermore, the present invention discloses arrangement of resistive storage elements of a microelectronic device horizontally. Thereby, the geometry and the manufacturing costs of the microelectronic device are reduced considerably.

Further, the present invention discloses production of a storage element of a microelectronic device by producing a cavity in an insulating layer thereby uncovering a part of an essentially vertical side wall of each of a first and second conductor made of a first electrode material and to deposit a second electrode material on the uncovered part of the vertical side wall of one of these through-hole conductors. After the deposition of the second electrode material a storing material is deposited in the cavity. Particularly, the present invention discloses depositing of the second electrode material by means of vapour-deposition or by a sputtering process or by an implantation of atoms transforming the first electrode material to the second electrode material wherein the direction from the source to the surface of the substrate is non-vertical to the surface.

The present invention considerably reduces the complexity of the geometry and of the manufacturing procedure and correspondingly reduces the manufacturing costs of a microelectronic device with storage elements in a chain architecture. It is a further advantage of the present invention that each single storage cell requires only $4F^2$ of chip area, wherein F is the minimum linear dimension. The storage states of the storing material of the storage elements are preferably changed and sensed electrically. Preferably the storage states of the storing material are permanent, or non-volatile and can be changed once in a single programming process (like in ROM device) or multiple times (like in RAM devices). Alternatively the storage states are volatile.

BRIEF DESCRIPTION OF THE DRAWINGS

The present invention is described in more detail below with reference to the exemplary embodiments and drawings, in which:

FIGS. 1 to 9 are schematic views of a first embodiment of the present invention during a manufacturing process.

FIGS. 12 to 16 are schematic views of a second embodiment of the present invention during a manufacturing process.

DETAILED DESCRIPTION OF THE INVENTION

FIGS. 1 to 9 display schematic views of vertical cross sections of a microelectronic device according to a first embodiment of the present invention. The microelectronic device is a memory device, preferably a non-volatile memory device, or any other microelectronic device comprising storage elements. For example, the microelectronic device is a processor with integrated cache or with an integrated non-volatile memory block. The storage elements are formed at the surface 12 of a substrate 10. The cross sectional area displayed in FIGS. 1 through 9 is vertical to the surface 12 of the substrate 10.

Figure 1:
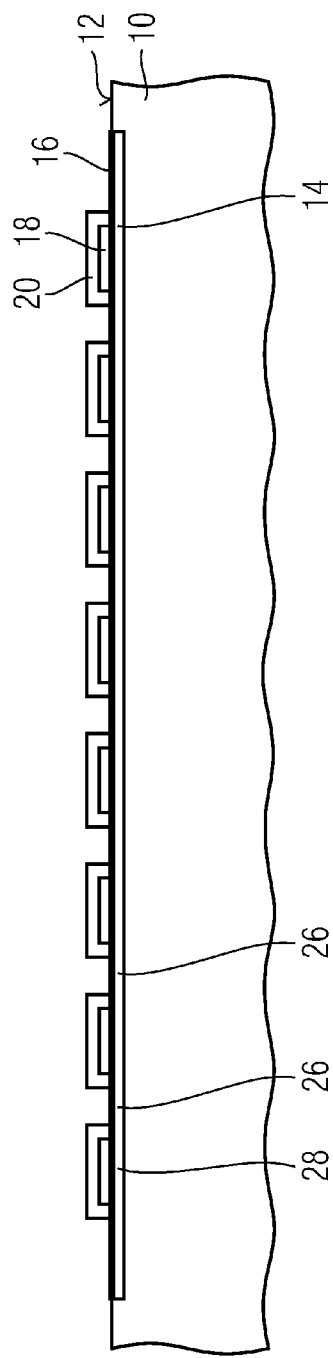

Referring to FIG. 1, an active area 14 is formed at the surface 12 in the substrate 10. An oxide layer 16 later on serving as a gate oxide layer is deposited on the active area. Strip-shaped word lines 18 made of an electrically conductive material are formed on the oxide layer 16. The word lines 18 are arranged parallel to the surface 12 of the substrate 10 and perpendicular to the cross-sectional area displayed in the FIGS. 1 through 9. The word lines 18 are covered with a thin electrically insulating layer 20. Thereby each word line is encapsulated by the oxide layer 16 and the thin electrically insulating layer 20. Those parts of the active area 14 positioned directly beneath the word lines 18 are channel regions 28. Those parts of the active area 14 arranged between the word lines 18 are source/drain regions 26.

Figure 2:
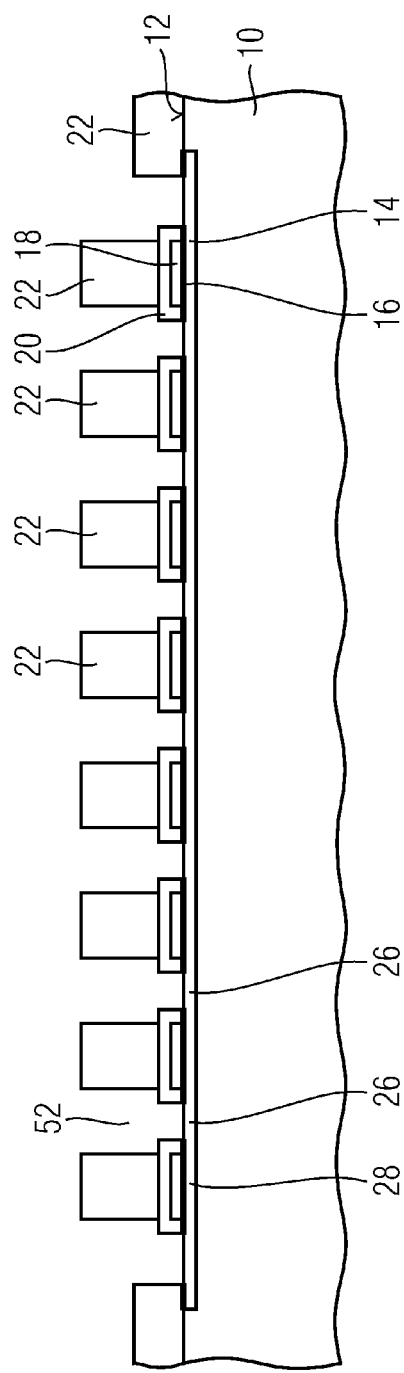

Referring to FIG. 2, a thick electrically insulating layer 22 is deposited over the surface 12 of the substrate 10 and over the word lines 18 and the thin electrically insulating layer 20. The thick electrically insulating layer 22 is laterally structured lithographically thereby producing openings, or vias, or through holes 52. The material of the thin electrically insulating layer 20, the material of the thick electrically insulating layer 22 and the etching process are selected such that the thin electrically insulating layer 20 is not worn. Thereby, the through-holes 52 are self-aligned with respect to the word lines 18 in the direction perpendicular to the word lines 18. The through-holes 52 completely penetrate the thick electrically insulating layer 22 and the gate oxide layer 16.

Figure 3:
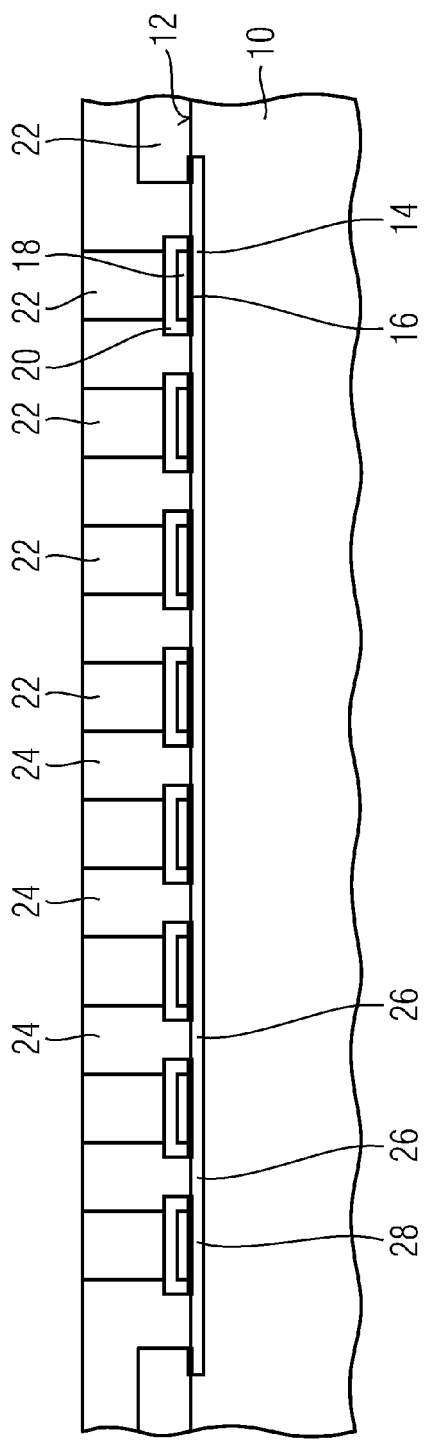

Referring to FIG. 3, the vias or through-holes 52 are filled with an electrically conductive material thereby forming through-hole conductors 24. The situation displayed in FIG. 3 is for example achieved by depositing the electrically conductive material with a subsequent CMP-step (CMP=Chemical Mechanical Polishing). The lower ends of the vertical through-hole conductors 24 abut on the surface 12 of the substrate 10 and thereby are electrically conductively connected to the source/drain regions 26.

Figure 4:
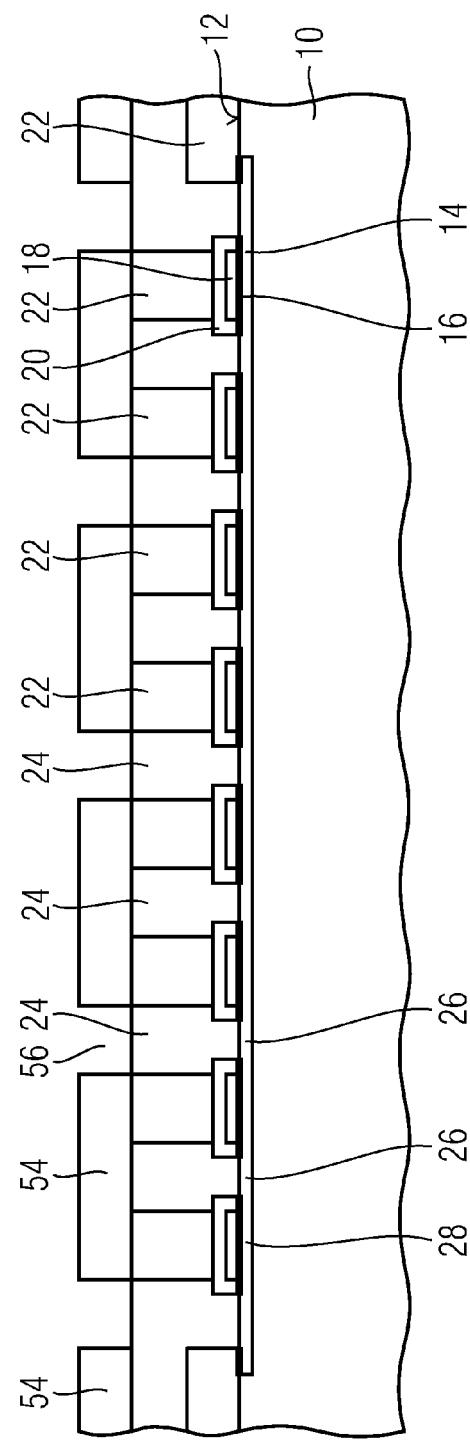

Referring to FIG. 4, another electrically insulating layer 54 is deposited and laterally structured by lithography, thereby producing openings 56. These openings 56 are laterally aligned with every second through-hole 24 and abut on their upper ends.

Referring to FIG. 5, the openings 56 are filled with a first electrode material thereby forming first electrodes 34 electrically conductively connected with the upper ends of every second vertical through-hole conductor 24. This is done by a deposition step and a subsequent polishing step or electrochemically or by any other suitable method.

Referring to FIG. 6, openings 58 are produced in the electrically insulating layer 54 lithographically. These openings 58 are laterally aligned with and abut on those vertical through-hole conductors 24 not connected to a first electrode 34.

Referring to FIG. 7, the openings 58 are filled with a second electrode material thereby forming second electrodes 36 electrically conductively connected with every second vertical through-hole conductor 24. The same methods as described above with reference to the first electrodes 34 can be used for the production of the second electrodes 36.

Referring to FIG. 8, cavities 60 are produced in the electrically insulating layer 54. Each cavity 60 uncovers a part of the essentially vertical side wall of a first electrode 34 and a part of the essentially vertical side wall of a second electrode 36. The etching process used for the production of the openings 60 preferably does not wear the material of the thick electrically insulating layer 22. Further, the etching process preferably does not wear the first and second electrode materials of the first and second electrodes 34, 36. Thereby, the cavities 60 are self-aligned in the direction perpendicular to the word lines 18.

Figure 9:
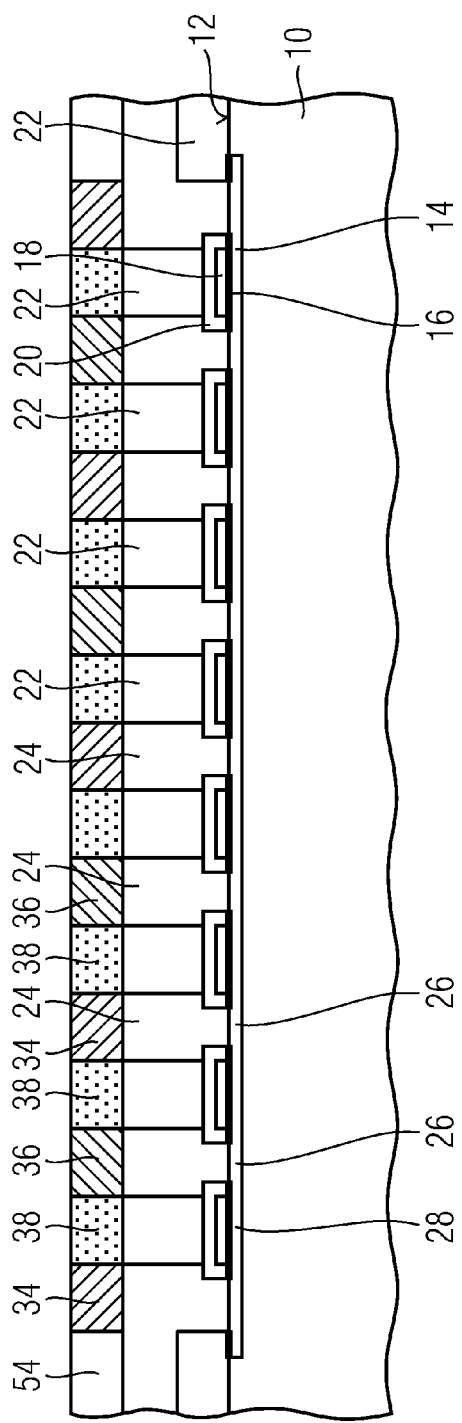

Referring to FIG. 9, the cavities 60 are filled with a storing material 38. The storing material 38 comprises an electrically insulating matrix, for example GeSe or an other chalcogenide. An electrically conductive material is diffused into the electrically insulating matrix and forms electrically conductive regions or islands within the electrically insulating matrix. The diffusion is photon-assisted. Alternatively any other methods may be used for the production of the storing material 38.

Figure 10:
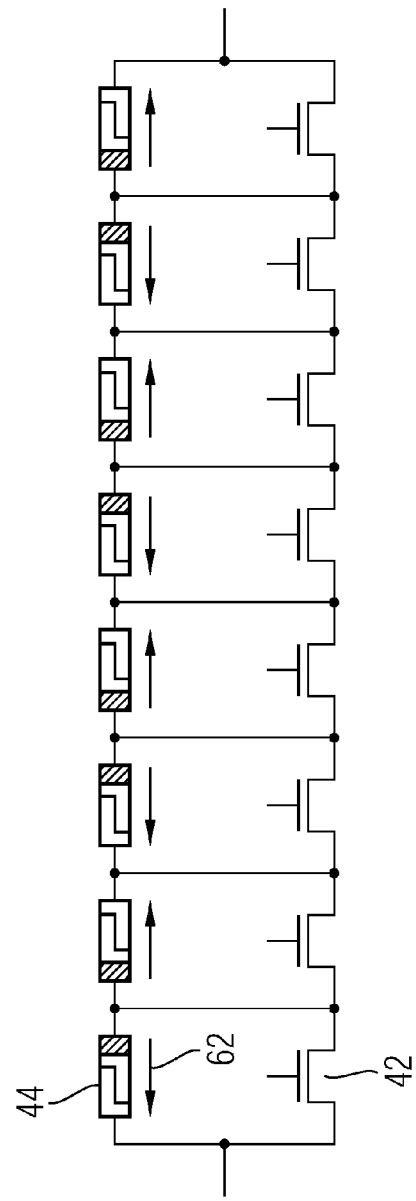
FIG. 10 is a schematic circuit diagram of the first embodiment.

FIG. 10 displays a schematic circuit diagram of the chain of storage elements produced by the above-described method. Each storing material 38 together with the adjacent first electrode 34 and the adjacent second electrode 36 form a resistive storage element 44. The resistive storage elements 44 are connected in series. Each channel region 28 together with the adjacent source/drain regions 26 forms a transistor 42. Each transistor 42 is connected parallel to a storage element 44 via through-hole conductors 24. The word lines 18 control the electrical conductivities of the transistors 42 and their channel regions 28.

Either the first or the second electrode material is a chemically inert material which does not take part in any chemical reaction during the programming process of the storage element 44. One example is tungsten (W). The other electrode material is an active material like silver (Ag). The application of a voltage above a predefined threshold to a storage element 44 starts an electrochemical reaction at the active electrode and drives ions into the insulating matrix. Thereby the conductive islands are increased and finally form a conductive bridge between the first and second electrodes 34, 36 reducing the electrical resistance of the storage element 44 by several orders of magnitude. A typical ON resistance is in the order of $10^5$ Ω.

An inverse voltage below a second (negative) threshold drives ions back to the active electrode and reverses the electrochemical reaction at the active electrode. The conductive islands are reduced and finally the conductive bridge is destroyed. The electrical resistance of the storage element 44 is increased by several orders of magnitude. A typical OFF resistance is in the order of $10^{10}$ Ω ... $10^{11}$ Ω.

The low ON resistance would cause an extreme current density destroying the storage element. Therefore, the current is preferably limited by a current limiting circuit not displayed in the Figures. Typically a voltage below 1 V (for example 220 mV) is used for writing a bit into a storage element by changing its conductivity state. The conductivity state is sensed and the bit stored in the storage element is read by the application of an even lower voltage (for example 100 mV) and the detection of the current flowing at this voltage.

During the access to a certain one of the storage elements 44, the corresponding transistor 42 is switched off and all the other transistors are switched on by the application of predefined voltages to the word lines 18. As can be seen from FIGS. 9 and 10, the polarity of the storage elements 44 is alternating along the serial connection. In FIG. 10 this fact is represented by the circuit symbols of the storage elements 44 and by arrows 62. Due to this alternating polarity the write and read circuit needs to be connected to the chain of storage elements 44 in two different ways. In other words, the polarity of the writing and reading voltages and currents need to be reversed from storage element to storage element.

Figure 11:
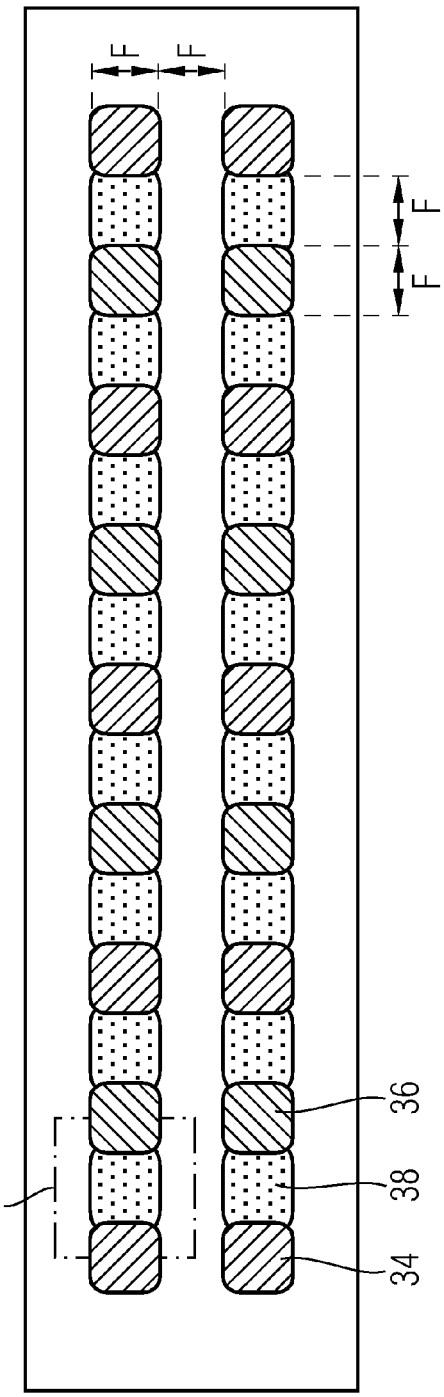
FIG. 11 is a schematic top view of the first embodiment.
Figure 12:
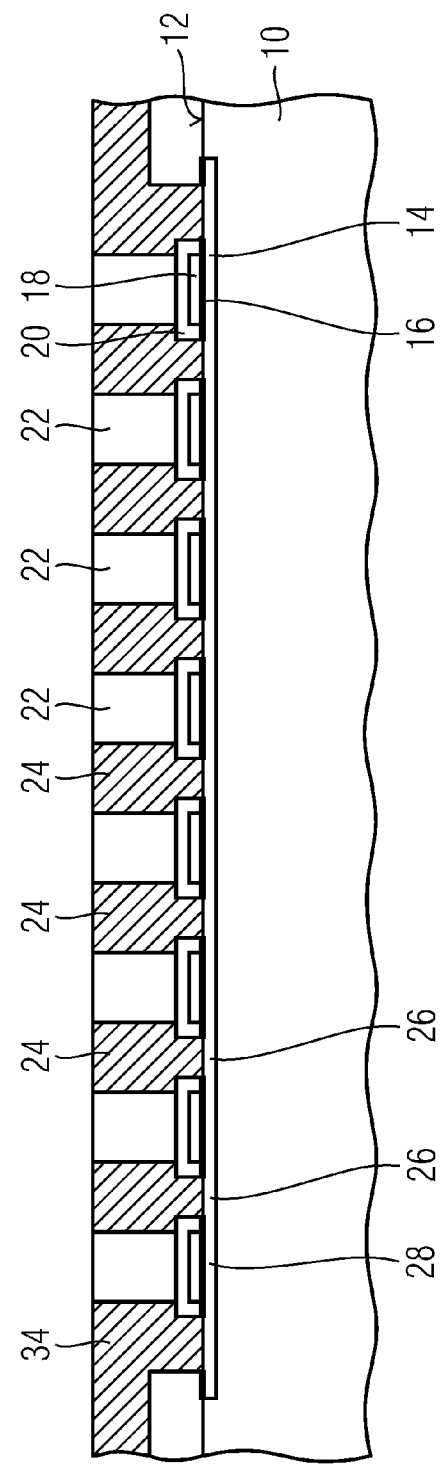

FIG. 11 is a schematic top view of the storage element displayed in FIG. 9. The linear dimensions of each first and second electrodes 34, 36 and their respective distances equal the minimum size F of any structure which can be produced by the respective technology. The broken line frame 64 indicates the size of one storage cell. As can be easily seen, the lateral area of each storage cell is $4F^2$. The microelectronic device according to the present invention provides very small storage cells and low manufacturing costs.

It is obvious that the embodiment described with reference to FIGS. 1 through 11 can be applied to the PCRAM technology and to memory technologies with other resistive storage elements as well, wherein each storage element comprises two electrodes made of the same material or made of two different materials.

The embodiment can be modified in many ways. For example the openings 56, 58 can be produced by selectively etching the upper ends of through hole conductors 24, which is a self aligned process. Further, at least the first electrodes 34 or the second electrodes 36 can be made integral with the respective through hole conductors 24.

The manufacturing process of a microelectronic device according to a second embodiment of the present invention is now described with reference to FIGS. 12 through 16. Like the FIGS. 1 trough 9, FIGS. 12 through 16 display schematic views of a cross-section vertical to the surface 12 of a substrate 10.

The first steps of the manufacturing process are similar to the steps described above with reference to FIGS. 1 to 3. However, as can be seen from FIG. 12, the electrically conductive material forming the through-hole conductors 24 is the first electrode material. Thus, the upper ends of the through-hole conductors 24 will form the first electrodes 34. In other words, the first electrodes 34 are integral with the through-hole conductors 24.

Referring to FIG. 13, cavities 60 are produced in the thick electrically insulating layer 22 by lithography. Each cavity 60 uncovers parts of the essentially vertical side walls of two adjacent vertical through-hole conductors 24.

Referring to FIG. 14, a second electrode material is deposited by vapour deposition or by a sputtering process. As indicated by the arrows 66, the direction from the source of the second electrode material to the substrate 10 is not vertical to the surface 12 of the substrate. The angle of incidence of the second electrode material is selected such that in each cavity 60 the second electrode material is only deposited on the vertical side wall of one of the adjacent vertical through-hole conductors 24, while the uncovered parts of the vertical side walls of the other through-hole conductor 24 adjacent to the same cavity is shadowed and therefore not covered for the second electrode material. The resulting second electrode material layer 68 is displayed in FIG. 14.

It is noted that when the second electrode material is the electrochemically active material, it is not necessary to produce a solid layer 68 as displayed in FIG. 14. Rather, a small amount of the active electrode material on the vertical side wall of one of the through-hole conductors 24 adjacent to each cavity 60 is sufficient.

Instead of depositing the second electrode material on the surface of the first electrode material of the vertical through-hole conductors 24, the first electrode material can be modified by implantation and thereby be transformed to the second electrode material.

Figure 15:
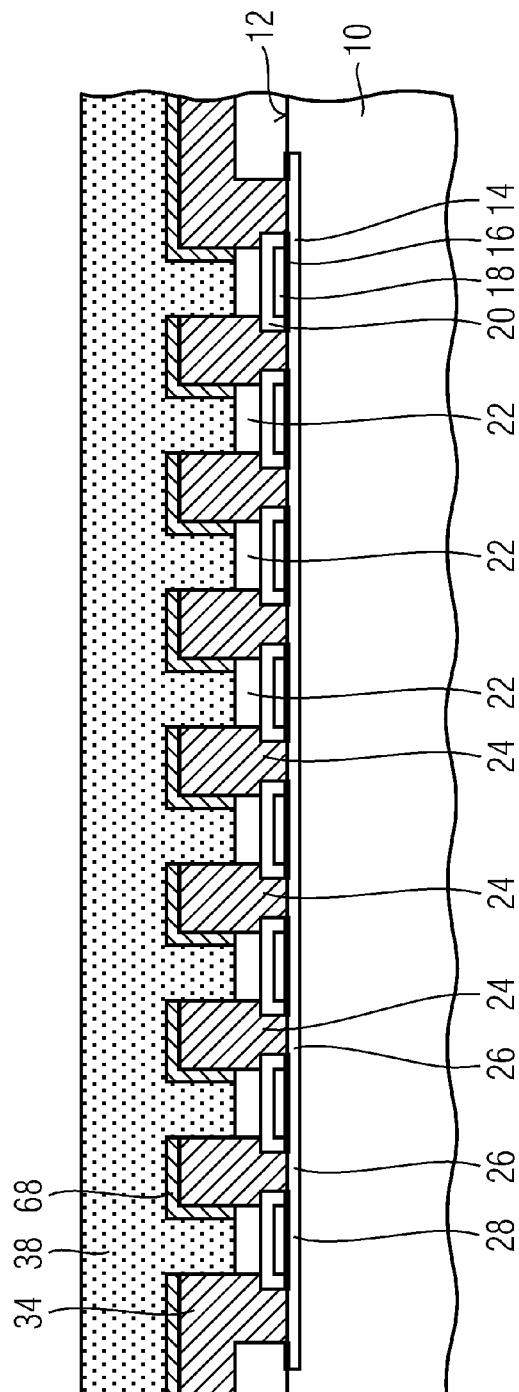

Referring to FIG. 15, the storing material 38 is deposited in the cavity 60 and over the vertical through-hole conductors 24. This is done in a similar way as described above with reference to FIG. 9.

Figure 16:
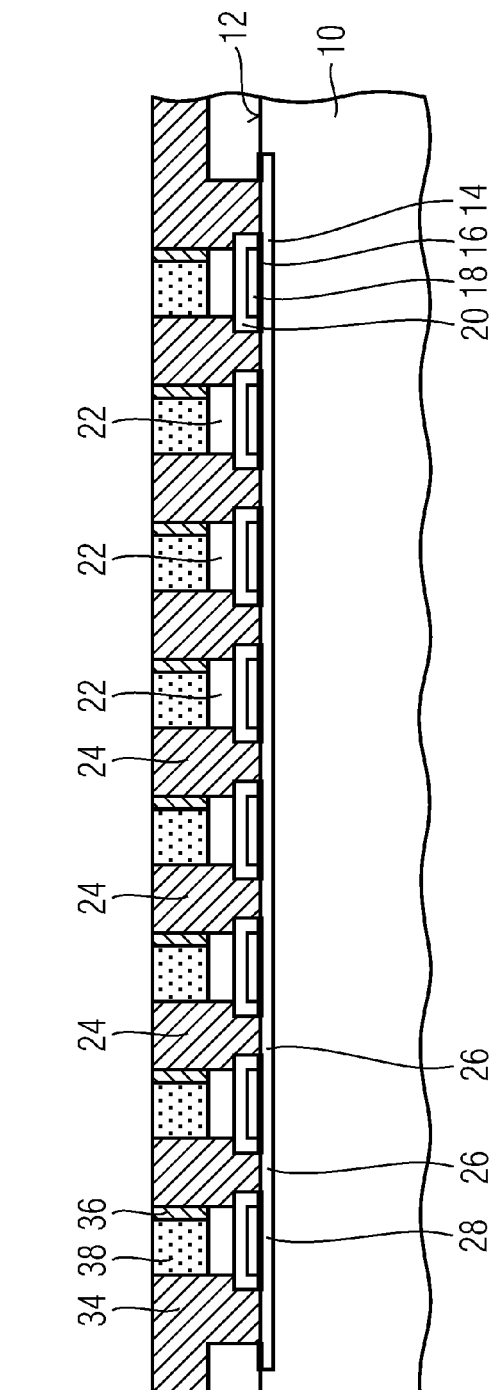

Referring to FIG. 16, the surplus storing material 38 outside the cavities 60 and the horizontal parts of the second electrode material layer 68 on top of the through-hole conductors 24 are removed by a CMP-step. The geometry produced with the above described method and displayed in FIG. 16 comprises a number of storage cells, each storage cell comprising a storing material 38, a first electrode 34 and an interface between the first electrode 34 and the storing material 38. The first electrode 34 of each storage cell comprises a backside opposite to the interface between the first electrode 34 and the storing material 38. The second electrode 36 of a second storage cell (in FIG. 16: on the left hand side of the first storage cell) is arranged on the backside of the first electrode 34 of the first storage cell.

Figure 17:
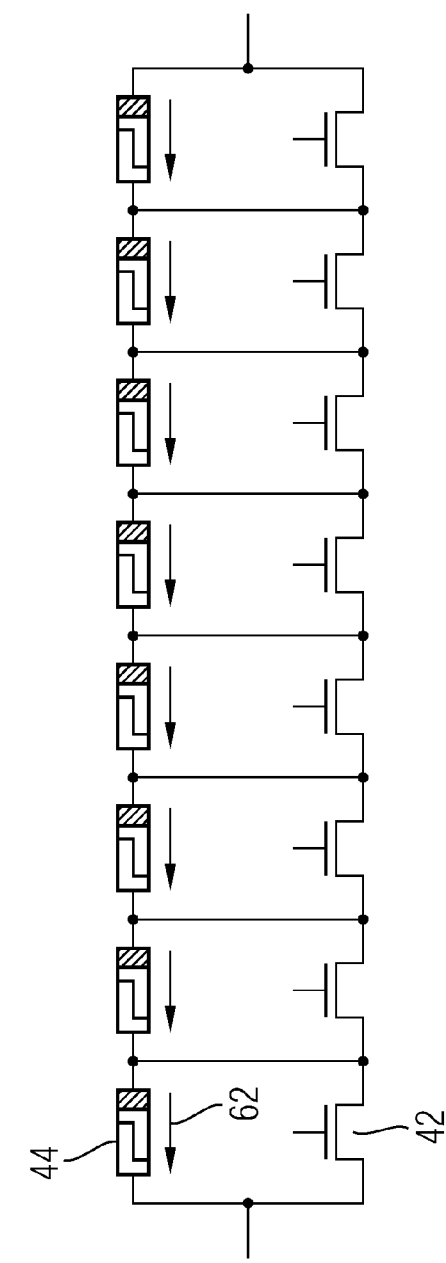
FIG. 17 is a schematic circuit diagram of the second embodiment.

FIG. 17 displays a schematic circuit diagram of the microelectronic device produced by the above-described process and displayed in FIG. 16. As can be easily seen, the polarities of all the storage elements 44 are equal. This means that the polarities of voltages and currents applied to or sensed at any storage element 44 during writing or reading, respectively, are equal for all storage elements 44. Thereby, the complexity of the writing and reading circuits is reduced considerably. Further, the complexity of the manufacturing process and hence the manufacturing costs are reduced considerably.

Figure 18:
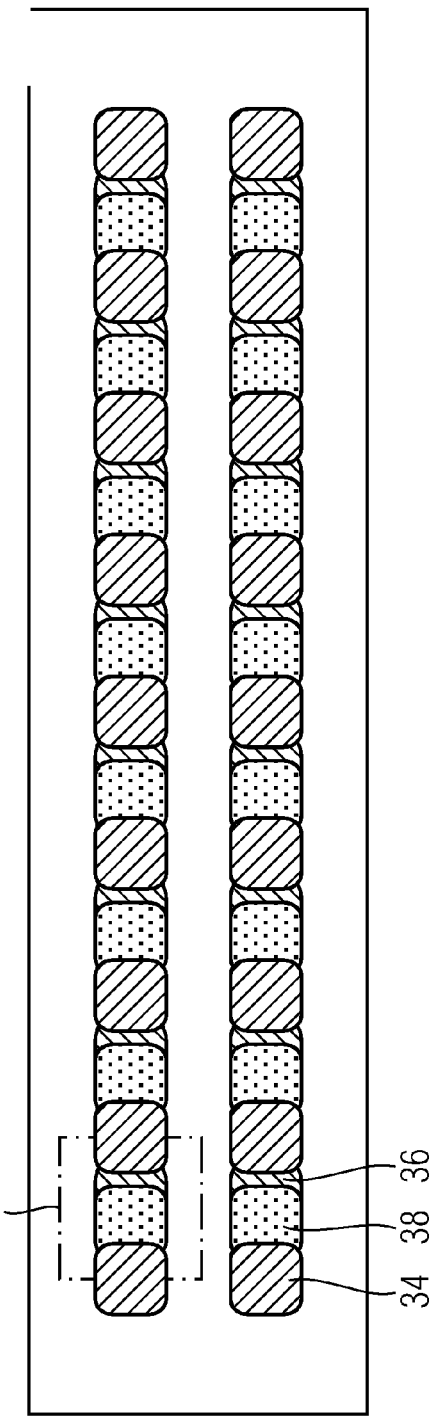
FIG. 18 is a schematic top view of the second embodiment.

Referring to FIG. 18, a schematical top view of the second embodiment is displayed. Again, the lateral area of one storage cell is $4F^2$. The same electrode materials (e. g. W and Ag) and the same storing material (e. g. GeSe with Ag islands) can be used as in the embodiment described above with reference to FIGS. 1 through 11.

It is obvious that the second embodiment is advantageous not only for a resistive storing material 38 but for all storage elements 44 comprising two different electrodes, wherein the storage states of the storing material are preferably changed and sensed electrically.

Furthermore, the method of manufacturing the storage cell, particularly the production of the second electrode by means of a source positioned non-vertical to the surface 12 of the substrate 10 is not limited to the chain architecture of the embodiment. Rather, any storage element with two different electrodes and any other microelectronic element with two different electrodes can be produced by this method advantageously.

Figure 19:
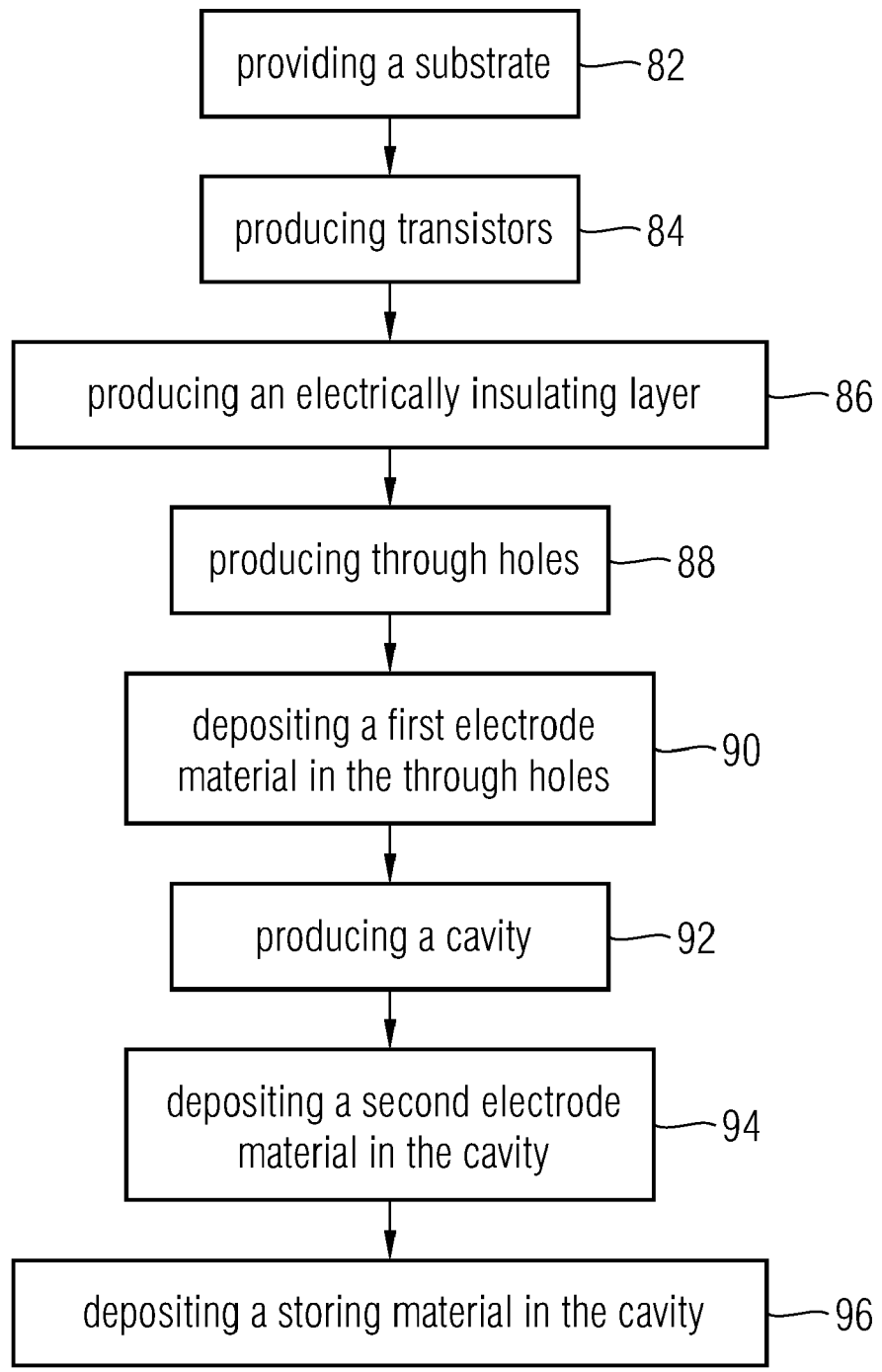
FIG. 19 is a schematic flow-chart of a method according to the present invention.
Figure 20:
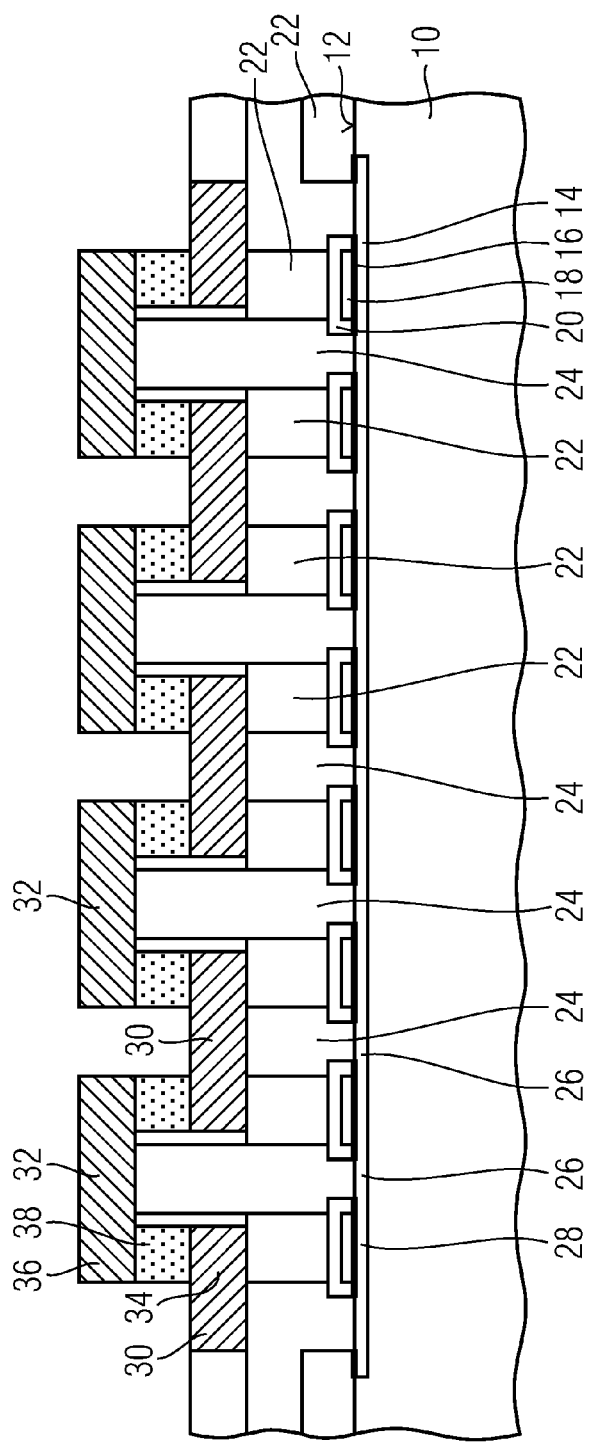
FIG. 20 is a schematic view of a conventional microelectronic device.
Figure 21:
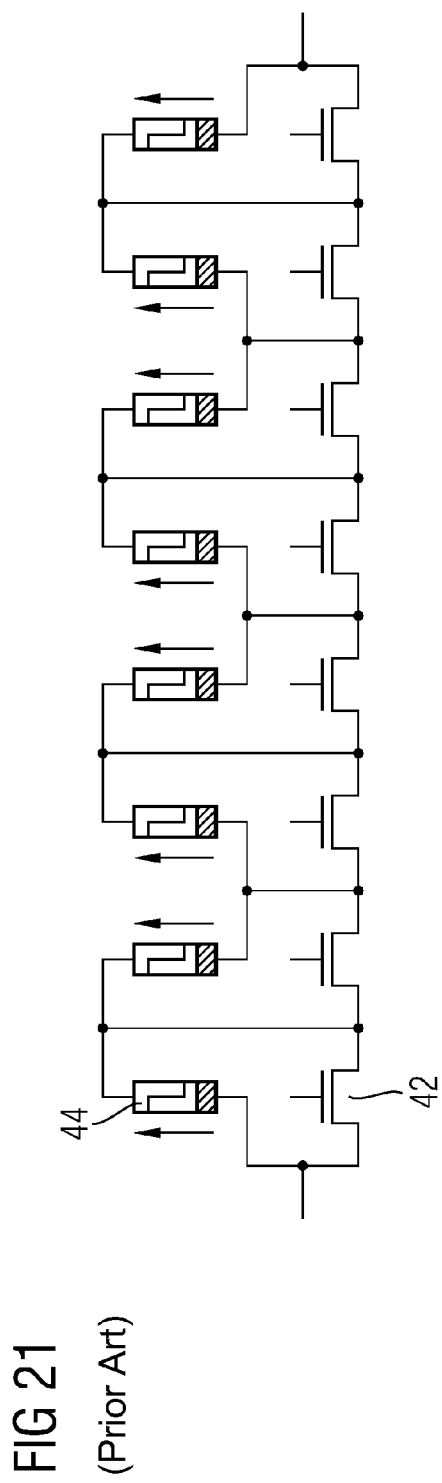
FIG. 21 is a schematic circuit diagram of a conventional microelectronic device.

FIG. 19 is a schematic flow-chart of a method of producing a microelectronic device according to the present invention. In a first step 82, a substrate 10 with a surface 12 is provided. In a second step 84, a plurality of transistors 42 with source and drain electrodes 26 are produced at the surface of the substrate. The source electrode of a first one of the plurality of transistors 42 is connected with a drain electrode of a second one of the plurality of transistors 42. In a third step 86, an electrically insulating layer 22 is produced over the plurality of transistors 42. In a fourth step 88, a plurality of through-holes 52 is produced in the insulating layer 22. Each through-hole abuts on the source electrode of one of the plurality of transistors 42 and on the drain electrode of another one of the plurality of transistors 42. In a fifth step 90 a first electrode material is deposited in the plurality of through-holes 52 thereby producing vertical through-hole conductors 24.

In a sixth step 92 a cavity is produced in the insulating layer 22, thereby uncovering a part of an essentially vertical side wall of a first one of the through-hole conductors 24 and a part of an essentially vertical side wall of a second one of the through-hole conductors. In a seventh step 94 in each cavity a second electrode material is deposited on the uncovered part of the essentially vertical side wall of one of the through-hole conductors contiguous to the cavity. In an eighth step 96 the storing material 38 is deposited in the cavity the storing material providing at least two different storing states with different electrical properties.

What is claimed is:

1. A microelectronic device, comprising:
a substrate with an upper surface;
a plurality of storage elements in serial connection formed at the upper surface of the substrate, each storage element comprising a storing material layer between a first electrode layer and a second electrode layer, the storing material layer providing at least two different storing states with different electrical properties, the first electrode layer comprising a first material and the second electrode layer comprising a second material different from the first material; and
a plurality of transistors, each transistor being connected parallel to one of the plurality of storage elements,
wherein the first electrode layer, the storing material layer, and the second electrode layer of each of the plurality of storage elements are arranged laterally along a same plane that is oriented parallel to the upper surface of the substrate.

2. The microelectronic device according to claim 1, wherein interfaces between the first and second electrode layers and the storing material layer are perpendicular to the upper surface of the substrate.

3. The microelectronic device according to claim 2, wherein the second electrode layer of a first storage element out of the plurality of storage elements adjoins the first electrode layer of a second storage element out of the plurality of storage elements.

4. The microelectronic device according to claim 3, wherein
the first electrode layer of the second storage element has a backside opposite to the interface between the first electrode layer of the second storage element and the storing material layer of the second storage element, and
the material of the second electrode layer of the first storage element is deposited on the backside of the first electrode layer of the second storage element.

5. The microelectronic device according to claim 4, further comprising:
an insulating layer positioned between the storing material layer of each storage element and the upper surface of the substrate;
through holes in the insulating layer; and
vertical through hole conductors, each through hole conductor being positioned in one of the through holes,
wherein the first electrode layer of each of the plurality of storage elements is one end of one of the vertical through hole conductors the other end of which is electrically conductively connected to a source/drain region under the upper surface of the substrate.

6. The microelectronic device according to claim 5, further comprising:
word lines oriented parallel to the upper surface of the substrate and perpendicular to the storage elements;
active areas under the upper surface of the substrate, each active area being positioned between a pair of through hole conductors connected to the same storage element; and
an insulating layer between the active areas and the word lines,
wherein the electrical conductivities of the active areas can be switched by the application of predefined voltages to the word lines.

7. The microelectronic device according to claim 1, wherein the memory device is a non-volatile memory device.

8. The microelectronic device according to claim 1, wherein
the storing material layer is of a resistive material, and
the at least two different storing states of the storing material layer are resistive states with different resistive values.

9. A microelectronic device, comprising:
a substrate with an upper surface;
a plurality of resistive storage elements in serial connection formed at the upper surface of the substrate, each resistive storage element comprising a resistive material layer between two electrode layers, the resistive material layer providing at least two different resistive states with different electrical resistance values; and
a plurality of transistors, each transistor being connected parallel to one of the plurality of resistive storage elements,
wherein the resistive material layer and the two electrode layers of each of the plurality of resistive storage elements are arranged laterally along a same plane that is oriented parallel to the surface of the substrate.

10. The microelectronic device according to claim 9, wherein
each resistive storage element comprises a resistive storing material layer between a first electrode layer and a second electrode layer, and
the first electrode layer comprises a first material and the second electrode layer comprises a second material different from the first material.

11. The microelectronic device according to claim 10, wherein the second electrode layer of a first resistive storage element out of the plurality of resistive storage elements adjoins the first electrode layer of a second resistive storage element out of the plurality of resistive storage elements.

12. The microelectronic device according to claim 11, wherein interfaces between the first and second electrodes layers and the resistive storing material layer are perpendicular to the upper surface of the substrate.

13. The microelectronic device according to claim 12, wherein
the first electrode layer of the second resistive storage element has a backside opposite to the interface between the first electrode layer of the second resistive storage element and the resistive storing material layer of the resistive second storage element, and
the material of the second electrode layer of the first resistive storage element is deposited on the backside of the first electrode layer of the second resistive storage element.

14. The microelectronic device according to claim 13, further comprising:
an insulating layer positioned between the resistive storing material layer of each resistive storage element and the upper surface of the substrate;
through holes in the insulating layer; and
vertical through hole conductors, each through hole conductor being positioned in one of the through holes,
wherein the first electrode layer of each of the plurality of resistive storage elements is one end of one of the vertical through hole conductors, the other end of which is electrically conductively connected to a source/drain region under the upper surface of the substrate.

15. The microelectronic device according to claim 14, further comprising:
- word lines oriented parallel to the upper surface of the substrate and perpendicular to the resistive storage elements;
- active areas under the upper surface of the substrate, each active area being positioned between a pair of through hole conductors connected to the same storage element; and
- an insulating layer between the active areas and the word lines,
- wherein the electrical conductivities of the active areas can be switched by the application of predefined voltages to the word lines.

16. The microelectronic device according to claim 9, wherein the memory device is a non-volatile memory device.

17. A microelectronic device, comprising:
- a substrate with an upper surface; and
- a storage element comprising a storing material layer between a first electrode layer and a second electrode layer, the storing material layer providing at least two different storing states with different electrical properties, the first electrode layer comprising a first material and the second electrode layer comprising a second material different from the first material, wherein the first electrode layer, the storing material layer, and the second electrode layer of the storage element are arranged laterally along a same plane that is oriented parallel to the upper surface of the substrate.

* * * * *